(12) United States Patent
Koo

(10) Patent No.: US 7,924,595 B2
(45) Date of Patent: Apr. 12, 2011

(54) HIGH-DENSITY SEMICONDUCTOR DEVICE

(75) Inventor: Kie Bong Koo, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/701,104

(22) Filed: Jan. 31, 2007

(65) Prior Publication Data

US 2008/0101135 A1 May 1, 2008

(30) Foreign Application Priority Data

Oct. 27, 2006 (KR) .................. 10-2006-0105248

(51) Int. Cl.
*H03K 19/094* (2006.01)

(52) U.S. Cl. ............. 365/83; 365/230.03; 365/189.05; 326/113; 326/82; 326/86; 326/58

(58) Field of Classification Search ............... 326/82–83, 326/86–87, 113; 365/230.03, 189.05, 230.06, 365/194, 63, 189.07, 189.01, 157–158, 209
See application file for complete search history.

(56) References Cited

U.S. PATENT DOCUMENTS

| 5,124,951 | A | * | 6/1992 | Slemmer et al. | ......... 365/230.06 |
| 5,194,764 | A | * | 3/1993 | Yano et al. | .............. 326/86 |
| 6,065,092 | A | * | 5/2000 | Roy | .................... 711/5 |
| 6,920,068 | B2 | * | 7/2005 | Ku | ............... 365/189.02 |
| 7,206,213 | B2 | * | 4/2007 | Kim | ................. 365/63 |
| 2004/0047404 | A1 | * | 3/2004 | Kim | ................. 375/211 |
| 2004/0189352 | A1 | | 9/2004 | Jeon | |
| 2006/0092714 | A1 | | 5/2006 | Lee | |
| 2006/0098515 | A1 | | 5/2006 | Mochida | |

FOREIGN PATENT DOCUMENTS

| CN | 1794354 | 6/2006 |
| KR | 10-2004-0022905 A | 3/2004 |
| KR | 10-2005-0000990 A | 1/2005 |
| KR | 10-2006-0026313 A | 3/2006 |

* cited by examiner

*Primary Examiner* — James H. Cho
*Assistant Examiner* — Christopher Lo
(74) *Attorney, Agent, or Firm* — John P. White; Cooper & Dunham LLP

(57) ABSTRACT

A high-density semiconductor device includes a first input/output line connected among a plurality of banks on a core area storing data, so that it transmits data, a second input/output line connected to a data pad capable of performing data input/output operations at a Peri-area, so that it transmits data, a first repeater connected between the first input/output line and the second input/output line, for transmitting data of the first input/output line to the second input/output line in response to a read enable signal enabled by a read command, and a second repeater connected between the first input/output line and the second input/output line, for transmitting data of the second input/output line to the first input/output line in response to a write enable signal enabled by a write command.

14 Claims, 4 Drawing Sheets

HIGH-DENSITY SEMICONDUCTOR DEVICE

BACKGROUND

The present disclosure relates to a high-density semiconductor device, and more particularly to a high-density semiconductor device capable of reducing a time consumed for loading data on a global Input/Output (I/O) line.

In general, the higher the density of a DRAM, the larger the chip size, resulting in the deterioration of DRAM characteristics. Specifically, if the DRAM has at least 8 banks, the length of the global input/output (GIO) line is greatly extended, and the extended GIO line increases the loading time of the GIO line, resulting in the deterioration of address access time (tAA) characteristics.

Typically, in the case of reading data from a DRAM, cell data is selected by a column selection signal, is amplified by a main amplifier, and is then loaded on a global input/output (GIO) line. However, if the GIO line has a long length, a long period of time and a large amount of current signals are consumed to transfer data via the long GIO line, such that read- or write-operation characteristics are unavoidably deteriorated. A representative example of the long GIO line is a 2G DDR2 DRAM, because the 2G DDR2 DRAM including 8 banks must share 8 banks, such that it has the length of about 42000 μm.

BRIEF SUMMARY

In accordance with one aspect of the present disclosure, there is provided a high-density semiconductor device comprising a first input/output line connected among a plurality of banks on a core area storing data, so that it transmits data, a second input/output line connected to a data pad capable of performing data input/output operations at a Peri-area, so that it transmits data, a first repeater connected between the first input/output line and the second input/output line, for transmitting data of the first input/output line to the second input/output line in response to a read enable signal enabled by a read command, and a second repeater connected between the first input/output line and the second input/output line, for transmitting data of the second input/output line to the first input/output line in response to a write enable signal enabled by a write command.

Preferably, the first repeater comprises a delay unit for delaying the read enable signal by a predetermined period of time; a transfer unit buffering a signal of the first input/output line, and transmitting the buffered first input/output line signal for in response to an output signal of the delay unit; and a buffer, unit for buffering a signal received from the transfer unit, and outputting the buffered signal to the second input/output line.

Preferably, the transfer unit comprises a buffer for buffering the first input/output line signal, a first transfer element for transferring an output signal of the buffer as a pull-up signal, in response to the output signal of the delay unit; and a second transfer element for transferring an output signal of the buffer as a pull-down signal, in response to the output signal of the delay unit.

Preferably, the buffer unit comprises a pull-up element for receiving the pull-up signal, and pull-up-driving the second input/output line using the received pull-up signal; and a pull-down element for receiving the pull-down signal, and pull-down-driving the second input/output line using the received pull-down signal.

Preferably, the first repeater comprises a pull-up element for, pull-up-driving the pull-up signal in response to the output signal of the delay unit, and a pull-down element for to the output signal of the delay unit, pull-down-driving the pull-down signal.

Preferably, the second repeater comprises a delay unit for delaying the write enable signal by a predetermined period of time a transfer unit buffering a signal of the second input/output line in response to an output signal of the delay unit, and transmitting the buffered second input/output line signal, and a buffer unit for buffering a signal received from the transfer unit and outputting the buffered signal to the first input/output line.

In accordance with another aspect of the present disclosure, there is provided a high-density semiconductor device comprising a first input/output line connected to some banks from among a plurality of banks on a core area storing data, so that it transmits data, a second input/output line connected to a data pad capable of performing data input/output operations at a Peri-area, so that it transmits data, and a repeater connected between the first input/output line and the second input/output line, for exchanging data between the first input/output line and the second input/output line by replying to an enable signal enabled by a read- or write-command.

The high-density semiconductor device according to the present disclosure includes a global input/output line repeater which separates a global input/output line for the core-area from a global input/output line for the Peri-area, and is operated by a pulse signal including bank information, such that a time consumed for loading data of the input/output line can be reduced. Also, the above-mentioned high-density semiconductor device allows a plurality of banks to share the global input/output line, such that the number of necessary global input/output lines can be reduced.

The high-density semiconductor device according to the present disclosure separates the first global input/output line (LGIO) of the core area from the second global input/output line (MGIO) of the Peri-area, and reduces a total length of the global input/output line (GIO), such that a time and current required for performing data transition via the global input/output (GIO) line can also be reduced.

The high-density semiconductor device includes a repeater located between the first global input/output line (LGIO) and the second global input/output line (MGIO), such that the repeater can exchange data between the first global input/output line (LGIO) and the second global input/output line (MGIO) according to the read- or write-command. During the read or write operation, data can be exchanged between the first global input/output line (LGIO) and the second global input/output line (MGIO). As a result, there is no need to use the first global input/output line (LGIO) and the second global input/output line (MGIO) for each read/write operation, resulting in the reduction of a chip size.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF PREFERRED EMBODIMENTS

Figure 1:
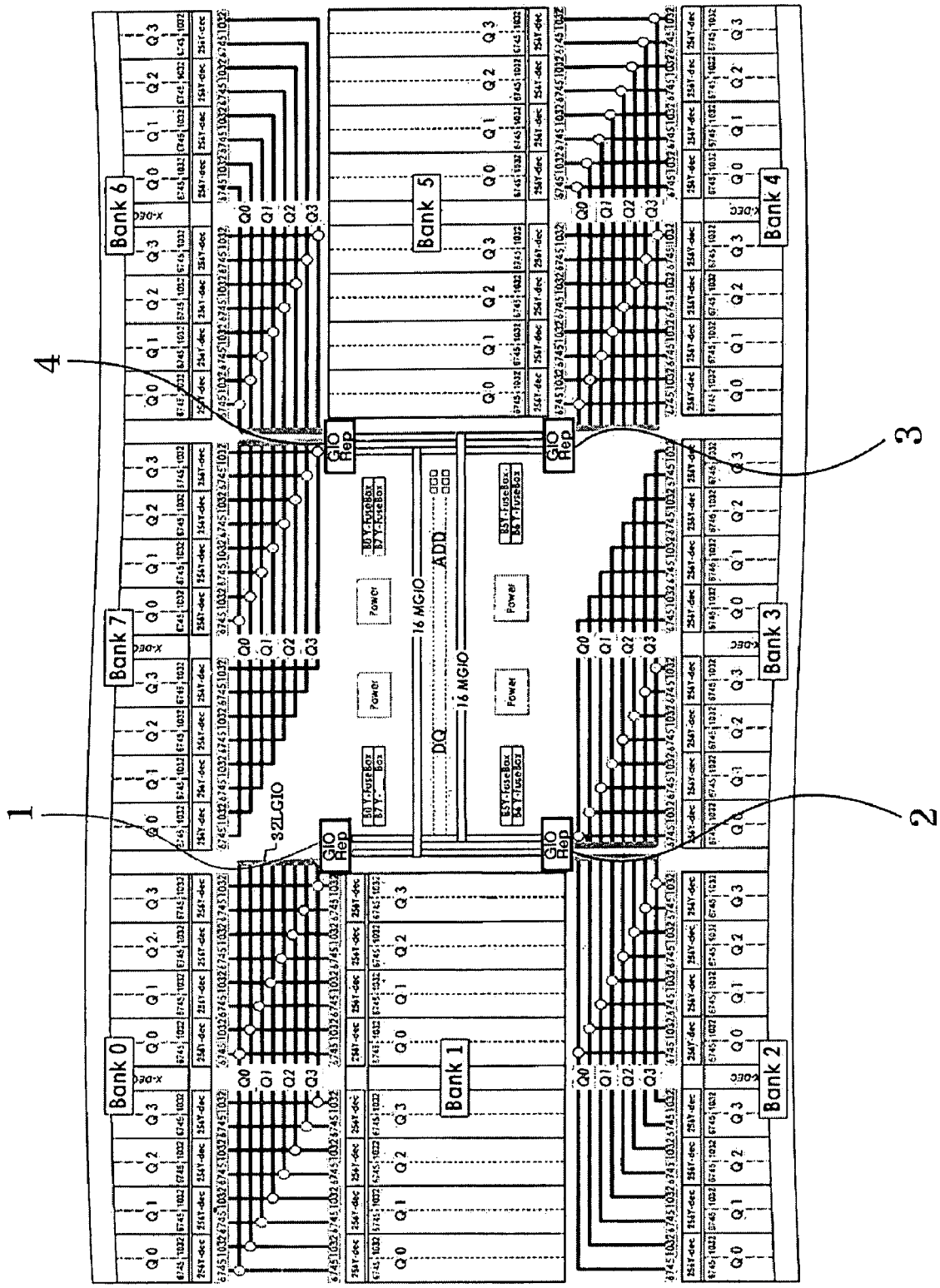
FIG. 1 is a circuit diagram illustrating a high-density semiconductor device, according to a preferred embodiment of the present disclosure.

Preferred embodiments of the present disclosure will now be described in detail with reference to the accompanying drawings. In the drawings, the same or similar elements are denoted by the same reference numerals even though they are depicted in different drawings. In the following description, a detailed description of known functions and configurations incorporated herein will be omitted when it may make the subject matter of the present disclosure rather unclear.

FIG. 1 is a circuit diagram illustrating a high-density semiconductor device according to a preferred embodiment of the present disclosure. In more detail, FIG. 1 shows a 2G DDR2 DRAM including 8 banks to perform a 4-bit prefetch operation.

Referring to FIG. 1, the high-density semiconductor device according to the present disclosure includes a first global input/output line (LGIO) connected to first to eighth banks (Banks 0~7) on a core area including data, so that it transmits data, a second global input/output line (MGIO) connected to a data pad (DQ) capable of performing data input/output (I/O) operations at a Peri-area equipped with a control circuit, so that it transmits data, and first to fourth repeaters 1-4 (GIO Reps) which are connected between the first global input/output line (LGIO) and the second global input/output line (MGIO), and exchange data between the first global input/output line (LGIO) and the second global input/output line (MGIO), in response to a first enable signal (MGIO_P) enabled by a Read-command or a second enable signal (LGIO_P) enabled by a Write-command.

The first global input/output line (LGIO) is connected to the first to eighth banks (BANKs 0~7) and the first to fourth repeaters (1~4) on a core area equipped with a memory cell. In more detail, the first global input/output line (LGIO) connected between the first bank (Bank 0) and the second bank (Bank 1) is connected to the first repeater (1). The first global input/output line (LGIO) connected to the third and fourth banks (Banks 2~3) is connected to the second repeater 2. The first global input/output line (LGIO) connected between the fifth bank (Bank 4) and the sixth bank (Bank 5) is connected to the third repeater 3. The first global input/output line (LGIO) connected to the seventh and eighth banks (Banks 6~7) is connected to the fourth repeater 4.

The second global input/output line (MGIO) is connected to a control circuit for controlling a memory cell, is connected to first to fourth repeaters (1~4) and the data pad (DQ) on the Peri-area which includes not only the control circuit for controlling a memory cell but also the data pad (DQ) for the data input/output (I/O) operations, such that it receives data from the data pad (DQ) or outputs data to the data pad (DQ).

The above-mentioned global input/output (GIO) line according to the present disclosure is divided into the first global input/output line (LGIO) and the second global input/output line (MGIO), such that the first global input/output line (LGIO) is located at the core area and the second global input/output line (MGIO) is located at the Peri-area. Therefore, the length of the first global input/output line (LGIO) is reduced down to a maximum of about 8000 μm, and the length of the second global input/output line (MGIO) is reduced down to a maximum of about 8000 μm, such that a time and current required for performing data transition via the global input/output (GIO) line can be reduced.

The 2G DDR2 DRAM according to the present disclosure includes 8 main-amp (main amplifiers) output signals for each bank. If the 2G DDR2 DRAM performs the 4-bit prefetch operation, 4 data units are processed in parallel, such that 32 first global input/output lines (LGIOs) and 32 second global input/output lines (MGIOs) are required to process the 4 data units in parallel. Therefore, the number of main amplifiers required for reading or writing data is set to "32" for each bank, and the number of first to fourth repeaters (1~4) connected to the first and second global input/output lines (LGIO) and (MGIO) is set to 32.

Each of the first to fourth repeaters (1~4) includes a read-purpose global input/output (GIO) line repeater 20 and a write-purpose global input/output (GIO) line repeater 30.

The read-purpose global input/output (GIO) line repeater 20 includes a delay unit 22, a transfer unit 24, and a buffer unit 26. The delay unit 22 includes inverter chains IV21 and IV22 for delaying the read-enable signal (MGIO_P) enabled by a read-command by a predetermined period of time. The transfer unit 24 includes a first transfer element T21 and a second transfer element T22. The first transfer element T21 transmits the first global input/output line (LGIO) signal buffered by an inverter IV24, and generates a pull-up signal (PU_R), in response to an output signal of the delay unit 22. The second transfer element 22 transmits the first global input/output line (LGIO) signal buffered by an inverter IV25, and generates a pull-down signal (PD_R). The buffer unit 26 includes a PMOS transistor P22 and a NMOS transistor N22. The PMOS transistor P22 pull-up the second global input/output line (MGIO), in response to the pull-up signal (PU_R). The NMOS transistor N22 pull-down the second global input/output line (MGIO), in response to the pull-down signal (PD_R).

The read-purpose global input/output (GIO) line repeater 20 further includes a PMOS transistor P21, a NMOS transistor N21, and a latch. The PMOS transistor P21 pull-up the pull-up signal (PU_R), in response to an output signal (PP_R) of the delay unit 22. The NMOS transistor N21 receives the output signal of the delay unit 22, inverts the received output signal of the delay unit 22 via an inverter IV23 to generate an inverted signal (PN_R), and pull-down the pull-down signal (PD_R) in response to the inverted signal (PN_R). The latch includes a plurality of inverters IV26 and IV27 to latch the output signal of the buffer unit 26.

The write-purpose global input/output (GIO) line repeater 30 includes a delay unit 32, a transfer unit 34, and a buffer unit 36. The delay unit 32 includes inverter chains IV31 and IV32 for delaying the write-enable signal (LGIO_P) enabled by a write-command. The transfer unit 34 includes a first transfer element T31 and a second transfer element T32. The first transfer element T31 transmits the second global input/output line (MGIO) signal buffered by an inverter IV34, and generates a pull-up signal (PU_W), in response to an output signal of the delay unit 32. The second transfer element 32 transmits the second global input/output line (MGIO) signal buffered by an inverter IV35, and generates a pull-down signal (PD_W). The buffer unit 36 includes a PMOS transistor P32 and a NMOS transistor N32. The PMOS transistor P32 pull-up the first global input/output line (LGIO), in response to the pull-up signal (PU_W). The NMOS transistor N32 pulls-down the first global input/output line (LGIO), in response to the pull-down signal (PD_W).

The write-purpose global input/output (GIO) line repeater 30 further includes a PMOS transistor P31, a NMOS transistor N31, and a latch. The PMOS transistor P31 pulls-up the pull-up signal (PU_W), in response to an output signal (PP_W) of the delay unit 32. The NMOS transistor N31 receives the output signal of the delay unit 32, inverts the received output signal of the delay unit 22 via an inverter IV33 to generate an inverted signal (PN_W), and pulls-down the pull-down signal (PD_W) in response to the inverted signal (PN_W). The latch includes a plurality of inverters IV36 and IV37 to latch the output signal of the buffer unit 36.

Operations of the above-mentioned high-density semiconductor device according to the present disclosure will hereinafter be described with reference to the annexed drawings.

Firstly, an exemplary case in which a read-command for reading data (Q3) stored in the first bank (Bank 0) is received in the semiconductor device will be described in detail.

If a read command for the first bank (Bank 0) is received in the semiconductor device, a bank-active signal is enabled, such that the first bank (Bank 0) is activated. A column storing data (Q3) is selected by a column selection signal. The Q3 data stored in the selected column is amplified by a main amplifier, and is loaded on the first global input/output line (LGIO). The above-mentioned read operations are similar to those of a general DRAM.

If the read command for the first bank (Bank 0) is received, the read enable signal (MGIO_P) is enabled. In this case, the read enable signal (MGIO_P) is synchronized with a clock signal corresponding to an enable signal capable of enabling the main amplifier, and includes bank information.

As previously stated above, the present disclosure relates to the 2G DDR2 DRAM which includes 8 main-amp output signals for each bank to perform the 4-bit prefetch operation, such that the first bank (Bank 0) is connected to the first global input/output line (LGIO). The first bank (Bank 0) and the second bank (Bank 1) share the first global input/output line (LGIO), such that the number of first global input/output lines (LGIOs) required for connecting the first and second banks (Banks 0~1) to the first repeater 1 can be reduced.

Figure 2:
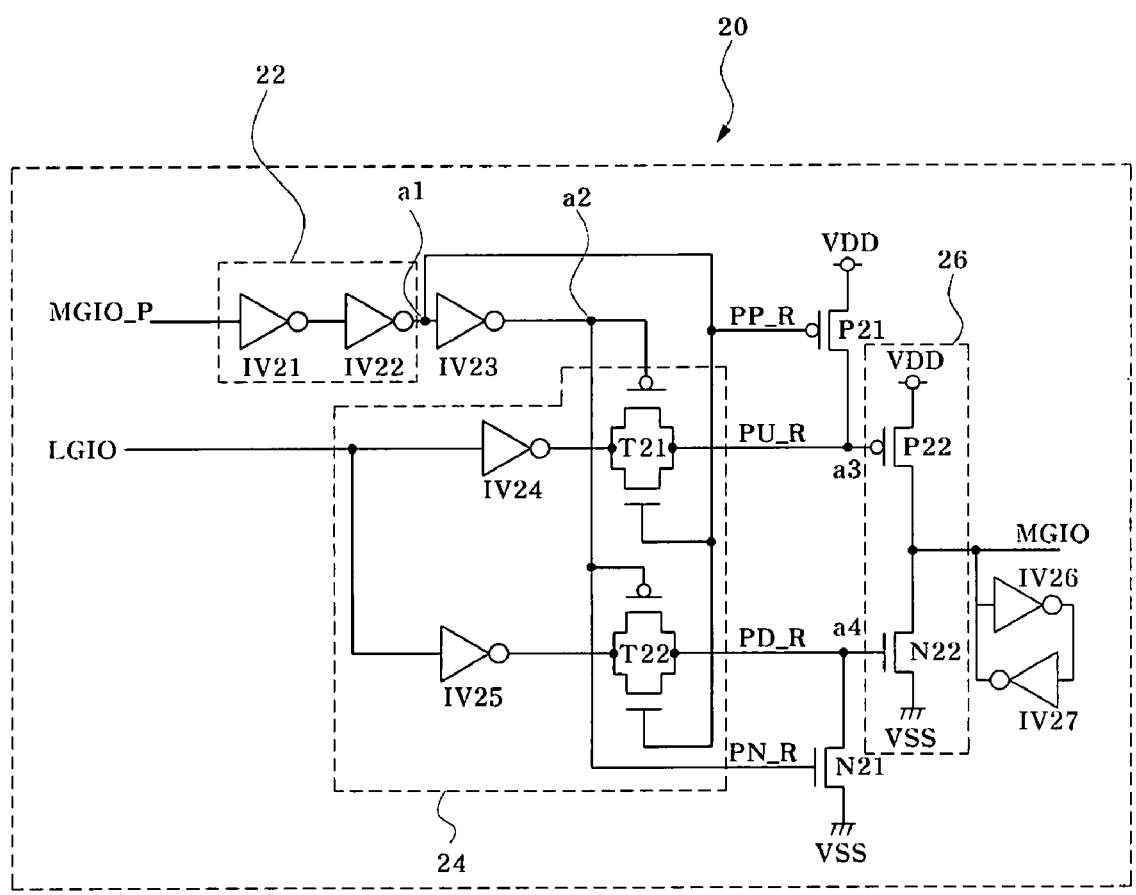
FIG. 2 is a circuit diagram illustrating a Read-purpose GIO line repeater for reading data, according to a preferred embodiment of the present disclosure.
Figure 3:
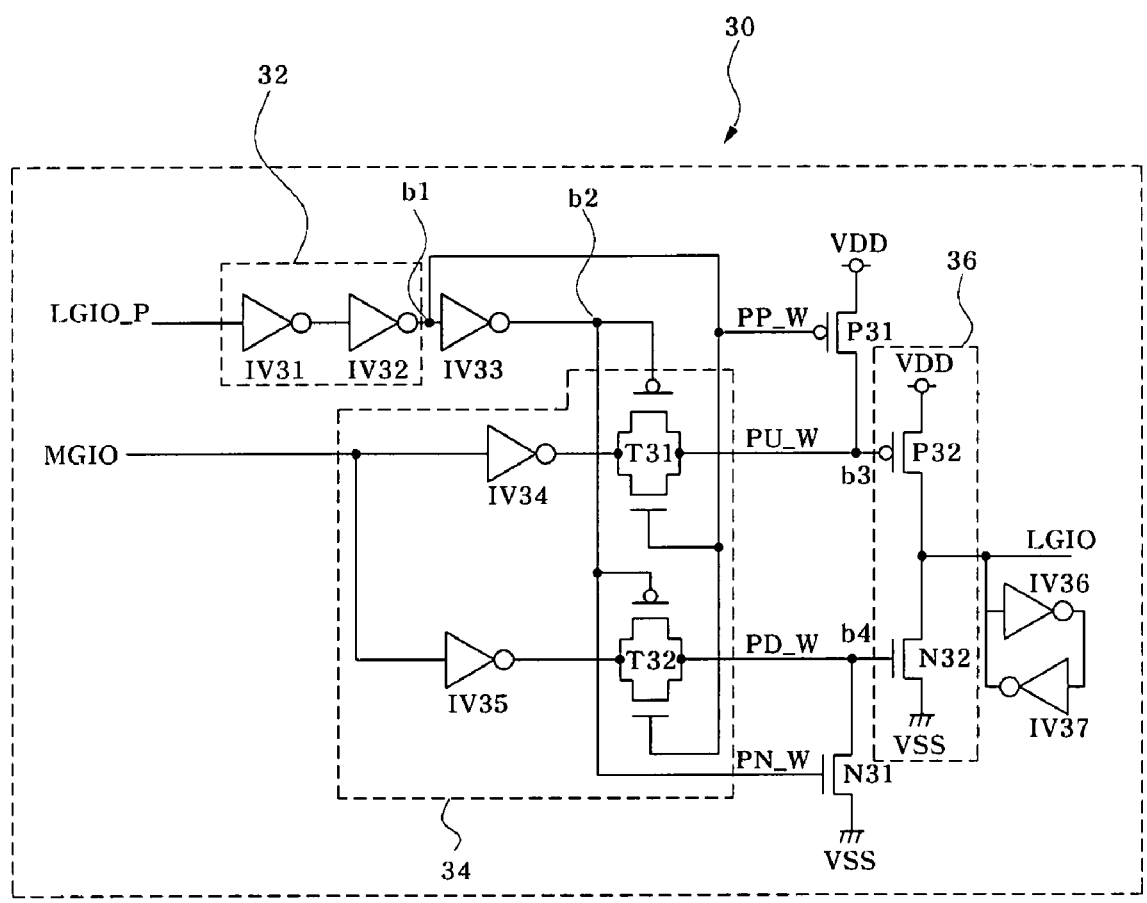
FIG. 3 is a circuit diagram illustrating a Write-purpose GIO line repeater for writing data, according to a preferred embodiment of the present disclosure.
Figure 4:
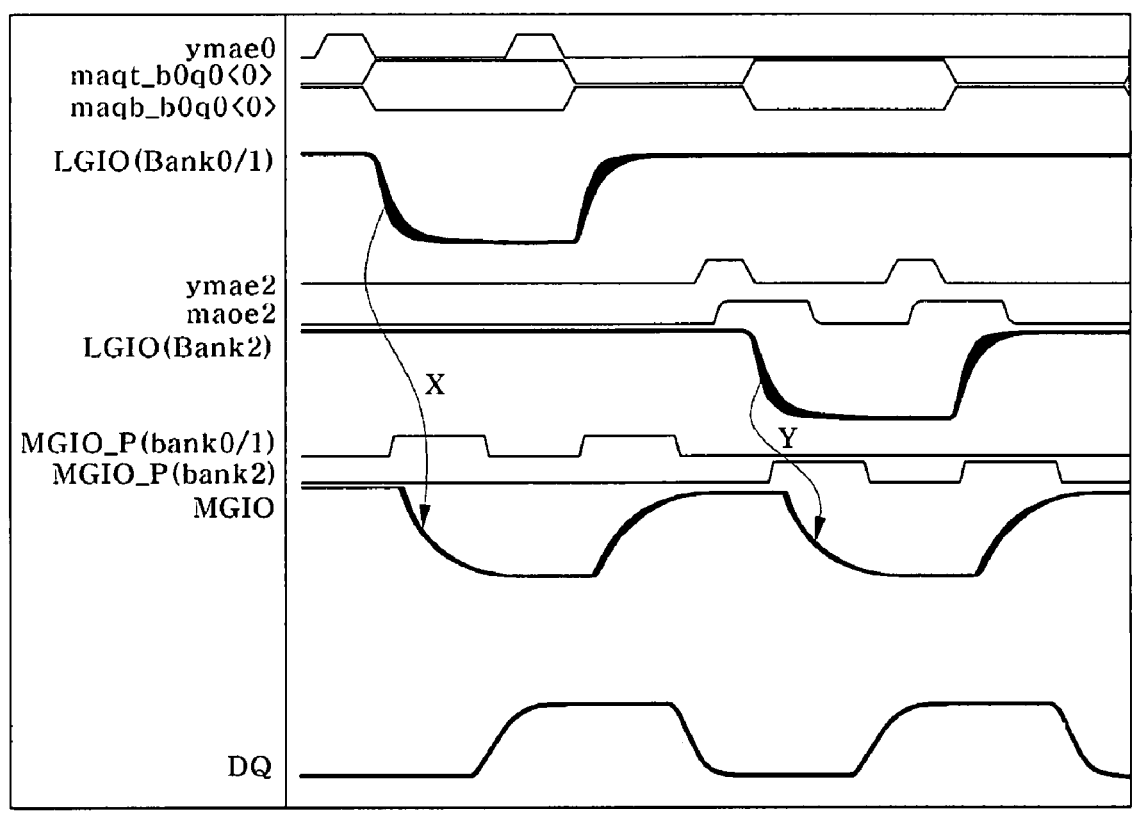
FIG. 4 is a timing diagram illustrating a process for outputting data when data is read from the high-density semiconductor device, according to a preferred embodiment of the present disclosure.

Each first global input/output line (LGIO) is connected to the read-purpose global input/output line repeater 20 of FIG. 2 and the write-purpose global input/output line repeater 30 of FIG. 3. If a read command for the first bank (Bank 0) is received, the read enable signal (MGIO_P) is enabled. The enabled read-enable signal (MGIO_P) activates the selected column of the first bank (Bank 0) and the read-purpose global input/output line repeater 20 connected to the first global input/output line (LGIO).

Operations of the above-mentioned read-purpose global input/output line repeater 20 will hereinafter be described with reference to FIG. 2.

Referring to FIG. 2, if the read enable signal (MGIO_P) enters a low level such that it is disabled, the node (a1) enters a low level, and the node (a2) enters a high level. Therefore, the transfer gates T21 and T22 are switched off, the PMOS transistor P21 and the NMOS transistor N21 are switched on, the node (a3) enters a high level, and the node (a4) enters a low level. The PMOS transistor P22 and the NMOS transistor N22 are switched off, such that data of the first global input/output line (LGIO) is not transmitted to the second global input/output line (MGIO).

In the meantime, if the read-enable signal (MGIO_P) enters a high level such that it is enabled, the node (a1) enters a high level, and the node (a2) enters a low level. Therefore, the transfer gates T21 and T22 are switched on, the PMOS transistor P21 and the NMOS transistor N21 are switched off, such that the inverted signal of the first global input/output line (LGIO) is transmitted to the nodes (a3 and a4). The buffer unit 20 inverts the signal received in the nodes (a3 and a4), such that data of the second global input/output line (LGIO) is transmitted to the first global input/output line (MGIO).

As described above, if the read enable signal (MGIO_P) is enabled, data of the first global input/output line (LGIO) is transmitted to the second global input/output line (MGIO)

Therefore, Q3 data stored in the column selected by the first bank (Bank 0) is transmitted via a line connected to the selected column from among 32 first global input/output lines (LGIOs). The read-purpose global input/output line repeater 20 contained in the first repeater 1 connected to the first global input/output line (LGIO) for transferring the Q3 data is enabled, so that Q3 data is transmitted to the second global input/output line (MGIO). The Q3 data transmitted to the second global input/output line (MGIO) is generated via the data pad (DQ).

Next, an exemplary case in which the write-command for writing data (Q3) stored in the second bank (Bank 1) is received in the semiconductor device will be described in detail.

If a write command for the second bank (Bank 1) is received in the semiconductor device, a bank-active signal is enabled, such that the second bank (Bank 1) is activated. The Q3 data is received via the data pad (DQ), data is loaded on the second global input/output line (MGIO).

If the write command for the second bank (Bank 1) is received, the write enable signal (LGIO_P) is enabled. In this case, the write enable signal (LGIO_P) is synchronized with a clock signal corresponding to an enable signal capable of enabling the main amplifier, and includes bank information.

Each second global input/output line (MGIO) is connected to the read-purpose global input/output line repeater 20 of FIG. 2 and the write-purpose global input/output line repeater 30 of FIG. 3. In this case, if a write command for the second bank (Bank 1) is received, the write enable signal (LGIO_P) is enabled. The enabled write-enable signal (LGIO_P) activates the data pad (DQ) and the write-purpose global input/output line repeater 30 connected to the second global input/output line (MGIO).

Operations of the above-mentioned write-purpose global input/output line repeater 30 will hereinafter be described with reference to FIG. 3.

Referring to FIG. 3, if the write enable signal (LGIO_P) enters a low level such that it is disabled, the node (b1) enters a low level, and the node (a2) enters a high level. Therefore, the transfer gates T31 and T32 are switched off, the PMOS transistor P31 and the NMOS transistor N31 are switched on, the node (a3) enters a high level, and the node (a4) enters a low level. The PMOS transistor P32 and the NMOS transistor N32 are switched off, such that data of the second global input/output line (MGIO) is not transmitted to the first global input/output line (LGIO).

In the meantime, if the write-enable signal (LGIO_P) enters a high level such that it is enabled, the node (b1) enters a high level, and the node (b2) enters a low level. Therefore, the transfer gates T31 and T32 are switched on, the PMOS transistor P31 and the NMOS transistor N31 are switched off, such that the inverted signal of the second global input/output line (MGIO) is transmitted to the nodes (b3 and b4).

The buffer unit 20 inverts the signal received in the nodes (b3 and b4), such that data of the second global input/output line (MGIO) is transmitted to the first global input/output line (LGIO).

As described above, if the write enable signal (LGIO_P) is enabled, data of the second global input/output line (MGIO) is transmitted to the first global input/output line (LGIO)

Therefore, Q3 data received via the data pad (DQ) is transmitted via the first global input/output line (LGIO) connected to the data pad (DQ) receiving the Q3 data from among 32 first global input/output lines (LGIOs). The write-purpose global input/output line repeater 30 contained in the first repeater 1 connected to the first global input/output line (LGIO) for transferring the Q3 data is enabled, so that the Q3 data is transmitted to the first global input/output line (LGIO). The Q3 data transmitted to the second global input/output line (MGIO) is stored in the selected column of the second bank (Bank 1) activated by the bank-active signal.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

The present application claims priority to Korean patent application number 10-2006-0105248, filed on Oct. 27, 2006, which is incorporated by reference in its entirety.

What is claimed is:

1. A high-density semiconductor device comprising:
a first bank group and a second bank group on a core area;
a first input/output line coupled to the first bank group, to transmit data;
a second input/output line coupled to the second bank group, to transmit data;
a data pad for inputting and outputting data on a peri area;
a third input/output line coupled to the data pad, to transmit data;
a first repeater comprising a first delay unit configured to delay a first read enable signal enabled by a read command for the first bank group by a predetermined period of time, a first buffer configured to buffer the first input/output line signal, a first transfer element configured to transfer an output signal of the first buffer as a first pull-up signal in response to the output signal of the first delay unit, and a second transfer element configured to transfer an output signal of the first buffer as a first pull-down signal in response to the output signal of the first delay unit, a first pull-up element configured to receive the first pull-up signal and pull-up the third input/output line, and a first pull-down element configured to receive the first pull-down signal and pull-down the third input/output line, wherein the first repeater is coupled between the first input/output line and the third input/output line.

2. A high-density semiconductor device comprising:
a first bank group and a second bank group on a core area;
a first input/output line coupled to the first bank group, to transmit data;
a second input/output line coupled to the second bank group, to transmit data;
a data pad for inputting and outputting data on a peri area;
a third input/output line coupled to the data pad, to transmit data;
a first repeater comprising a first delay unit configured to delay a first read enable signal enabled by a read command for the first bank group by a predetermined period of time, a first buffer configured to buffer the first input/output line signal, a first transfer element configured to transfer an output signal of the first buffer as a first pull-up signal in response to the output signal of the first delay unit, and a second transfer element configured to transfer an output signal of the first buffer as a first pull-down signal in response to the output signal of the first delay unit, a first pull-up element configured to receive the first pull-up signal and pull-up the third input/output line, and a first pull-down element configured to receive the first pull-down signal and pull-down the third input/output line,
wherein the first buffer includes an inverter and the first and second transfer elements include respective transfer gates.

3. The high-density device according to claim 1, wherein the first pull-up element includes a PMOS transistor, and the first pull-down element includes a NMOS transistor.

4. A high-density semiconductor device comprising:
a first bank group and a second bank group on a core area;
a first input/output line coupled to the first bank group, to transmit data;
a second input/output line coupled to the second bank group, to transmit data;
a data pad for inputting and outputting data on a peri area;
a third input/output line coupled to the data pad, to transmit data;
a first repeater comprising a first delay unit configured to delay a first read enable signal enabled by a read command for the first bank group by a predetermined period of time, a first buffer configured to buffer the first input/output line signal, a first transfer element configured to transfer an output signal of the first buffer as a first pull-up signal in response to the output signal of the first delay unit, and a second transfer element configured to transfer an output signal of the first buffer as a first pull-down signal in response to the output signal of the first delay unit, a first pull-up element configured to receive the first pull-up signal and pull-up the third input/output line, and a first pull-down element configured to receive the first pull-down signal and pull-down the third input/output line,
wherein the first repeater further comprises:
a second pull-up element configured to pull-up the first pull-up signal in response to the output signal of the delay unit; and
a second pull-down element configured to pull-down the first pull-down signal in response to the output signal of the delay unit.

5. The high-density semiconductor device according to claim 4, wherein the second pull-up element includes a PMOS transistor, and the second pull-down element includes a NMOS transistor.

6. The high-density semiconductor device according to claim 1, wherein the first repeater further comprises:
a latch configured to latch the output signal of the first buffer unit.

7. The high-density semiconductor device according to claim 1, further comprising:
a second repeater connected between the first input/output line and the third input/output line, configured to generate a second pull-up signal and a second pull-down signal in response to a first write enable signal enabled by a write command for the first bank group, and drive the first input/output line by the second pull-up signal and the second pull-down signal.

8. The high-density semiconductor device according to claim 7, wherein the second repeater comprises:
a second delay unit configured to delay the first write enable signal by a predetermined period of time, a second buffer configured to buffer the third input/output line signal, a third transfer element configured to transfer an output signal for the second buffer as the second pull-up signal in response to the output signal of the second delay unit and a fourth transfer element configured to transfer an output signal of the second buffer as the second pull-down signal in response to the output signal of the second delay unit, a second pull-up element configured to receive the second pull-up signal and pull-up the first input/output line, and a second pull-down element configured to receive the second pull-down signal and pull-down the first input/output line.

9. The high-density semiconductor device according to claim 7, further comprising:
a third repeater connected between the second input/output line and the third input/output line, configured to generate a third pull-up signal and a third pull-down signal in response to a second read enable signal enabled by a read command for the second bank group, and drive the third input/output line by the third pull-up signal and the third pull-down signal; and
a fourth repeater connected between the second input/output line and the third input/output line, configured to generate a fourth pull-up signal and a fourth pull-down signal in response to a second write enable signal enabled by a write command for the second bank group, and drive the second input/output line by the fourth pull-up signal and the fourth pull-down signal.

10. The high-density semiconductor device according to claim 9, wherein the third repeater comprises:
a third delay unit configured to delay the second read enable signal by a predetermined period of time, a third buffer configured to buffer the second input/output line signal, a fifth transfer element configured to transfer an output signal of the third buffer as the third pull-up signal in response to the output signal of the third delay unit, and a sixth transfer element configured to transfer an output signal of the third buffer as the third pull-down signal in response to the output signal of the third delay unit, a third pull-up element configured to receive the third pull-up signal and pull-up the third input/output line, and a third pull-down element configured to receive the third pull-down signal and pull-down the third input/output line.

11. The high-density semiconductor device according to claim 10, wherein the fourth repeater comprises:
a fourth delay unit configured to delay the second write enable signal by a predetermined period of time, a fourth buffer configured to buffer the third input/output line signal, a seventh transfer element configured to transfer an output signal of the fourth buffer as the fourth pull-up signal in response to the output signal of the fourth delay unit, and an eighth transfer element configured to transfer an output signal of the fourth buffer as the fourth pull-down signal in response to the output signal of the fourth delay unit, a fourth pull-up element configured to receive the fourth pull-up signal and pull-up the second input/output line, and a fourth pull-down element configured to receive the fourth pull-down signal and pull-down the second input/output line.

12. The high-density semiconductor device according to claim 1, wherein the first buffer includes an inverter and the first and second transfer elements include respective transfer gates.

13. The high-density semiconductor device according to claim 1, wherein the first repeater further comprises:
a second pull-up element configured to pull-up the first pull-up signal in response to the output signal of the delay unit; and
a second pull-down element configured to pull-down the first pull-down signal in response to the output signal of the delay unit.

14. The high-density semiconductor device according to claim 13, wherein the second pull-up element includes a PMOS transistor, and the second pull-down element includes a NMOS transistor.

* * * * *